(12) United States Patent
Satou et al.

(10) Patent No.: US 9,923,561 B2
(45) Date of Patent: Mar. 20, 2018

(54) RECONFIGURABLE DEVICE

(71) Applicant: Taiyo Yuden Co., Ltd., Tokyo (JP)

(72) Inventors: Masayuki Satou, Tokyo (JP); Isao Shimizu, Saitama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 15/514,179

(22) PCT Filed: Sep. 18, 2015

(86) PCT No.: PCT/JP2015/076610
§ 371 (c)(1),
(2) Date: Mar. 24, 2017

(87) PCT Pub. No.: WO2016/063667
PCT Pub. Date: Apr. 28, 2016

(65) Prior Publication Data
US 2017/0279451 A1    Sep. 28, 2017

(30) Foreign Application Priority Data

Oct. 22, 2014 (JP) .................................. 2014-215160

(51) Int. Cl.
*H03K 19/177* (2006.01)
*G11C 7/00* (2006.01)
(Continued)

(52) U.S. Cl.
CPC ..... *H03K 19/17728* (2013.01); *G06F 9/5061* (2013.01); *G11C 7/00* (2013.01);
(Continued)

(58) Field of Classification Search
CPC ......... H03K 19/17728; H03K 19/1776; H03K 19/17736; H03K 19/173; H03K 19/017581; H03K 19/17744; G11C 8/10; G11C 7/00; G11C 11/418; G11C 11/419; G06F 17/5054; G06F 17/5077
See application file for complete search history.

(56) References Cited

U.S. PATENT DOCUMENTS 8,767,501 B2 * 7/2014 Joshi ................... G06F 12/0864
365/230.03
8,952,721 B2 * 2/2015 Ishiguro ............. H03K 19/1776
326/38

(Continued)

FOREIGN PATENT DOCUMENTS

JP  2013-513139 A   4/2013
TW    201447888 A  12/2014

(Continued)

OTHER PUBLICATIONS

International Search Report and Written Opinion of PCT Application No. PCT/JP2015/076610, dated Oct. 27, 2015, 6 page of English Translation and 7 pages of ISRWO.

(Continued)

*Primary Examiner* — Vibol Tan
(74) *Attorney, Agent, or Firm* — Chip Law Group

(57) ABSTRACT

Main memory access from a CPU is reduced, and thus an increase in speed of data processing is achieved. Provided is a reconfigurable device (20) connected to a main memory (600). The reconfigurable device (20) includes a plurality of logic sections connected to each other by an address line or a data line. Each of the logic sections includes a plurality of address lines, a plurality of data lines, an address decoder that decodes addresses input from part of the plurality of address lines, and a memory cell array unit that includes a plurality of memory cells specified by decode lines of the address decoder, and outputs data read from the specified memory cells to the data lines. An address line of the memory cell array unit is connected to a data output line (RD1) of the main memory.

7 Claims, 13 Drawing Sheets

(51) Int. Cl.
    *G11C 11/00*     (2006.01)
    *G06F 9/50*     (2006.01)
    *G11C 8/10*     (2006.01)
    *G11C 11/418*     (2006.01)
    *G11C 11/419*     (2006.01)
    *H04N 19/00*     (2014.01)

(52) U.S. Cl.
    CPC .............. *G11C 8/10* (2013.01); *G11C 11/418* (2013.01); *G11C 11/419* (2013.01); *H03K 19/1776* (2013.01); *H03K 19/17736* (2013.01); *H03K 19/17744* (2013.01); *H04N 19/00* (2013.01)

(56) References Cited

U.S. PATENT DOCUMENTS

| | | | |
|---|---|---|---|
| 9,214,209 B2 * | 12/2015 | Ishiguro | H03K 19/1776 |
| 9,287,877 B2 * | 3/2016 | Satou | H03K 19/17732 |
| 9,350,357 B2 * | 5/2016 | Sato | H03K 19/1776 |
| 9,425,798 B2 * | 8/2016 | Satou | H03K 19/1776 |
| 9,425,800 B2 * | 8/2016 | Sato | H03K 19/17728 |
| 9,514,259 B2 * | 12/2016 | Sato | H03K 19/173 |
| 9,558,810 B2 * | 1/2017 | Satou | G11C 8/18 |
| 9,705,505 B2 * | 7/2017 | Satou | H03K 19/1774 |
| 9,729,154 B2 * | 8/2017 | Satou | H03K 19/1776 |

FOREIGN PATENT DOCUMENTS

| | | |
|---|---|---|
| WO | 2004/093445 A1 | 10/2004 |
| WO | 2014/163098 A2 | 10/2014 |

OTHER PUBLICATIONS

International Preliminary Report on Patentability of PCT Application No. PCT/JP2015/076610, dated Apr. 25, 2017, 5 pages.

* cited by examiner

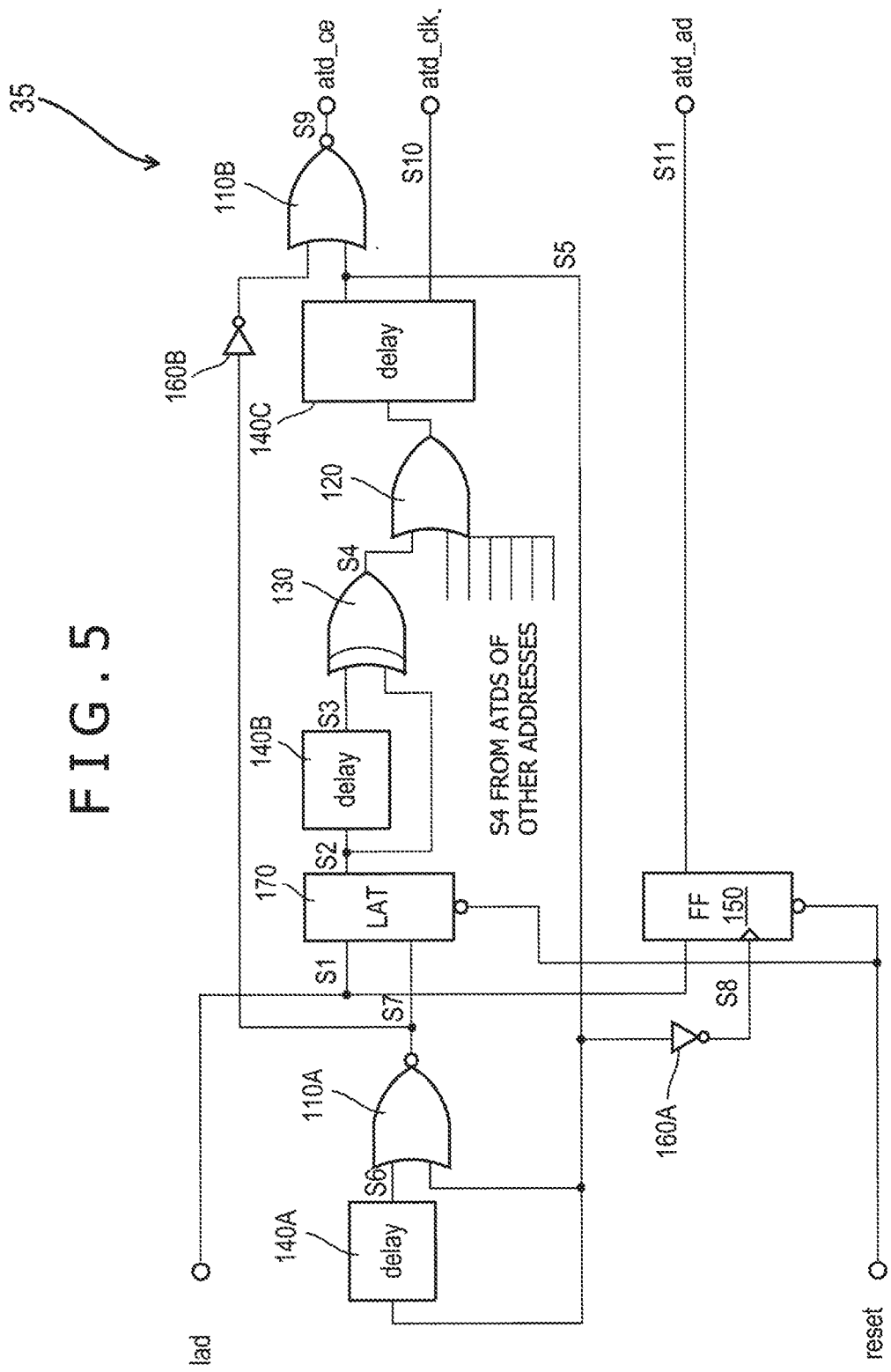
F I G . 5

FIG. 13
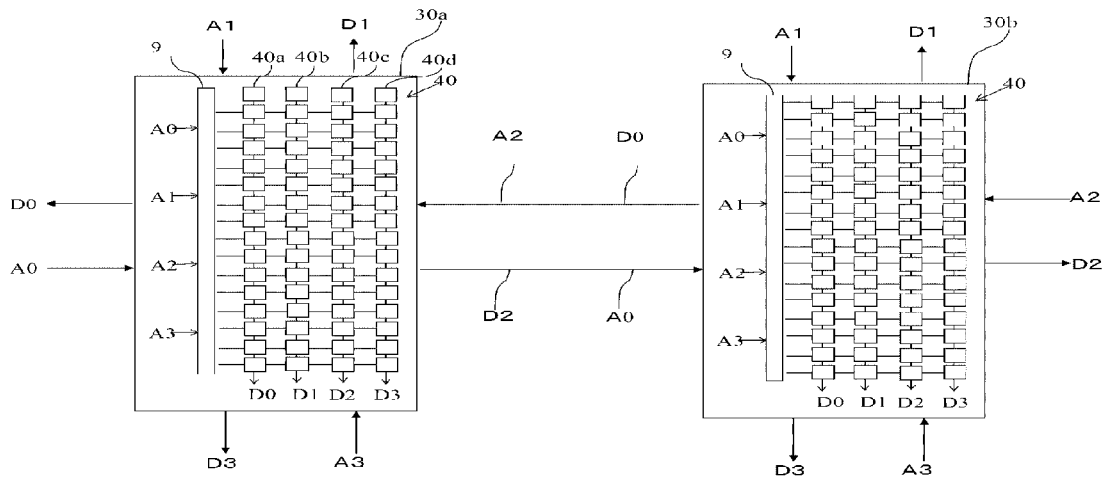
FIG. 14
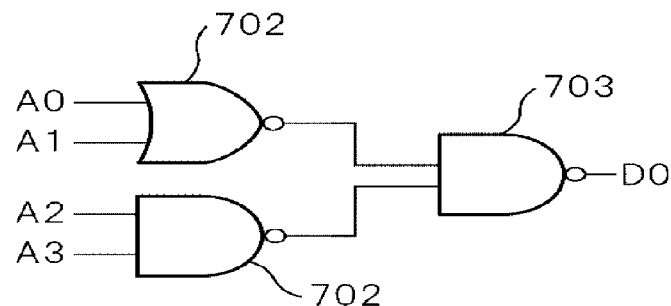
FIG. 15
| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG. 16
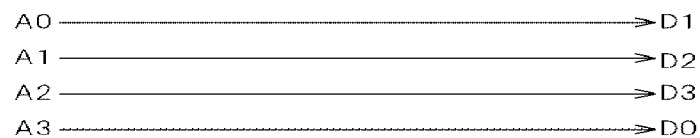
FIG. 17
| A0 | A1 | A2 | A3 | D0 | D1 | D2 | D3 |
|----|----|----|----|----|----|----|----|
| 0  | 0  | 0  | 0  | 0  | 0  | 0  | 0  |
| 1  | 0  | 0  | 0  | 0  | 1  | 0  | 0  |
| 0  | 1  | 0  | 0  | 0  | 0  | 1  | 0  |
| 1  | 1  | 0  | 0  | 0  | 1  | 1  | 0  |
| 0  | 0  | 1  | 0  | 0  | 0  | 0  | 1  |
| 1  | 0  | 1  | 0  | 0  | 1  | 0  | 1  |
| 0  | 1  | 1  | 0  | 0  | 0  | 1  | 1  |
| 1  | 1  | 1  | 0  | 0  | 1  | 1  | 1  |
| 0  | 0  | 0  | 1  | 1  | 0  | 0  | 0  |
| 1  | 0  | 0  | 1  | 1  | 1  | 0  | 0  |
| 0  | 1  | 0  | 1  | 1  | 0  | 1  | 0  |
| 1  | 1  | 0  | 1  | 1  | 1  | 1  | 0  |
| 0  | 0  | 1  | 1  | 1  | 0  | 0  | 1  |
| 1  | 0  | 1  | 1  | 1  | 1  | 0  | 1  |
| 0  | 1  | 1  | 1  | 1  | 0  | 1  | 1  |
| 1  | 1  | 1  | 1  | 1  | 1  | 1  | 1  |
FIG. 18
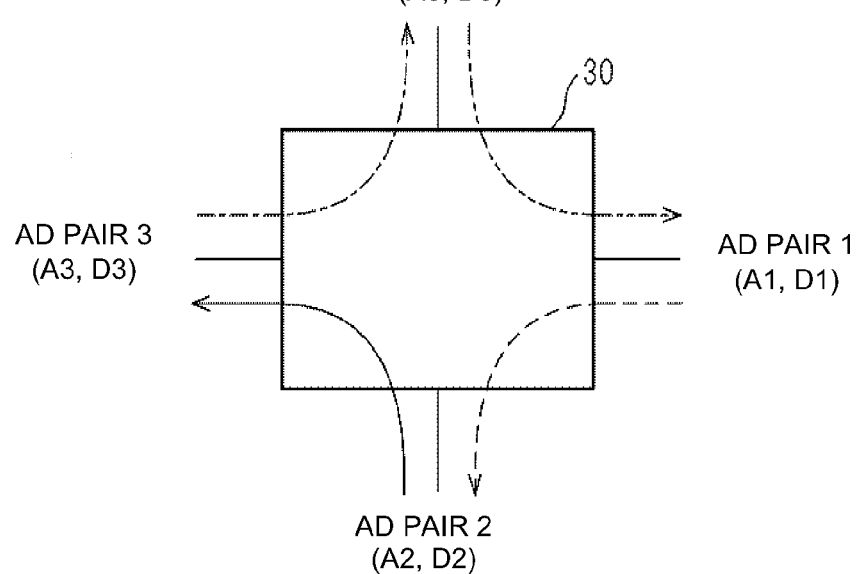

FIG. 19
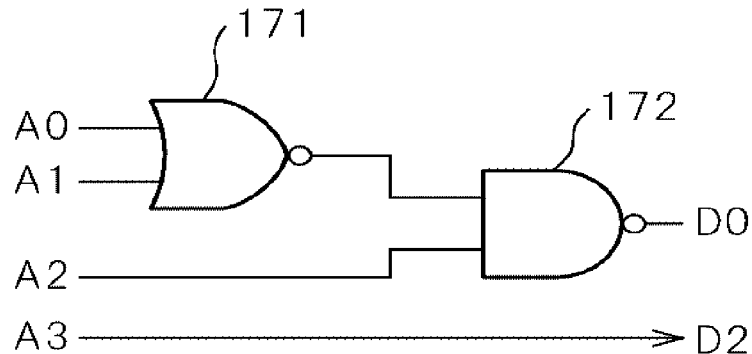
FIG. 20
| A0 | A1 | A2 | A3 | D0 | D1 | D2 | D3 |
|----|----|----|----|----|----|----|----|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |
FIG. 21
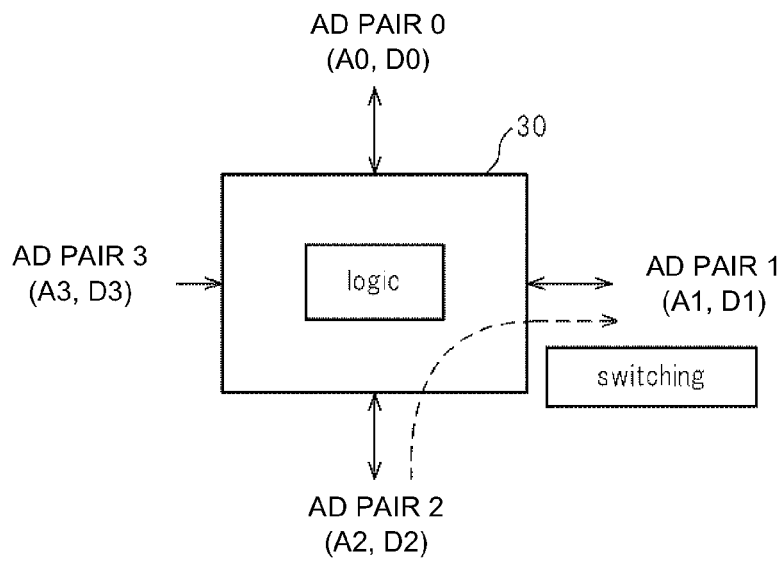

RECONFIGURABLE DEVICE

CROSS REFERENCE TO RELATED APPLICATIONS

This application is a U.S. National Phase of International Patent Application No. PCT/JP2015/076610 filed on Sep. 18, 2015, which claims priority benefit of Japanese Patent Application No. JP 2014-215160 filed in the Japan Patent Office on Oct. 22, 2014. Each of the above-referenced applications is hereby incorporated herein by reference in its entirety.

TECHNICAL FIELD

The present invention relates to a reconfigurable device and a semiconductor device including the same.

BACKGROUND ART

Improvements in the operation speed of central processing units (CPUs) with semiconductor microfabrication have been made on the basis of Moore's law. However, Moore's law is coming to an end. A reason for this is a limit of microfabrication. Ten nanometer is said to be the limit. The present semiconductor manufacturing technology is approaching the limit, and increases in speed of data processing due to CPU improvements have been slowed.

A CPU performs arithmetic processing on data retained within a register. The CPU prefetches data as an object of operation from a cache into the register. When data within the cache is not target data, the CPU determines that a "cache miss" has occurred, and performs processing of reading the data from a main memory.

In cases of data centers or the like where a large amount of data processing is necessary, in particular, a time of access to the main memory increases more than that of arithmetic processing. This represents a bottleneck in data processing, and invites delays. In addition, power consumption in data transfer is increased due to needs for increases in speed, and servers need to be cooled. Power reduction in data centers has therefore become a challenge. Incidentally, such a CPU architecture is shown in FIG. 1 of PTL 1, for example.

CITATION LIST

Patent Literature

[PTL 1]
  JP-T-2013-513139

SUMMARY

Technical Problems

There is a strong tendency to cause delays in data processing as described above when there is a large amount of data, though arithmetic processing itself is repetitions of simple operations. Therefore, sophisticated processing such as is performed by a processor is not necessary. An increase in speed of data processing can therefore be achieved by performing data processing on a memory side without transferring data to the CPU, and allowing the CPU to be used when sophisticated arithmetic processing is necessary.

A semiconductor device according to the present embodiment is disposed on the side of a main memory, and is in charge of repetitions of simple operation. Main memory access from a CPU is thereby reduced, and an increase in speed of data processing is thus achieved. According to a mode for solving the above-described problems, a semiconductor device is realized as illustrated by the following item set.

1. A reconfigurable device connected to a main memory, the reconfigurable device including:
   a plurality of logic sections connected to each other by an address line or a data line;
   each of the logic sections including
     a plurality of address lines,
     a plurality of data lines,
     an address decoder that decodes addresses input from part of the plurality of address lines, and
     a memory cell array unit that includes a plurality of memory cells specified by decode lines of the address decoder, and outputs data read from the specified memory cells to the data lines;
   an address line of the memory cell array unit being connected to a data output line of the main memory.

2. The reconfigurable device according to item 1, wherein the memory cell unit is a multi-look-up table.

The present semiconductor device performs operation as a logic element and/or a connecting element in the multi-look-up table, and is therefore clearly different from a field programmable gate array (FPGA) that implements wiring connection by a selecting circuit.

3. The reconfigurable device according to item 1 or 2, wherein each of the logic sections includes
   a first address decoder that decodes addresses input from part of the plurality of address lines,
   a second address decoder that decodes addresses input from other part of the plurality of address lines,
   a first memory cell unit that has a plurality of memory cells specified by decode lines of the first address decoder, and
   a second memory cell unit that has a plurality of memory cells specified by decode lines of the second address decoder.

4. The semiconductor device according to item 3, wherein the first memory cell unit and the second memory cell unit store a plurality of pieces of truth table data, and are connected to second plural address lines that output data specifying one of the plurality of pieces of truth table data.

It is possible to provide a reconfigurable semiconductor device in which high-capacity memories are utilized and redundant addresses can be controlled by page switching control.

5. A semiconductor device including:
   a main memory; and
   a reconfigurable device connected to the main memory;
   the reconfigurable device including a plurality of logic sections connected to each other by an address line or a data line;
   each of the logic sections including
     a plurality of address lines,
     a plurality of data lines,
     an address decoder that decodes addresses input from part of the plurality of address lines, and
     a memory cell array unit that includes a plurality of memory cells specified by decode lines of the address decoder, and outputs data read from the specified memory cells to the data lines;
   a data output of the memory cell array unit being connected to an address line of the main memory.

6. The semiconductor device according to item 6, further including:

a second reconfigurable device;
the second reconfigurable device including a plurality of logic sections connected to each other by an address line or a data line;
each of the logic sections including
a plurality of address lines,
a plurality of data lines,
an address decoder that decodes addresses input from part of the plurality of address lines, and
a memory cell array unit that includes a plurality of memory cells specified by decode lines of the address decoder, and outputs data read from the specified memory cells to the data lines;
a data output of the memory cell array unit being connected to an address line of the main memory.

7. The semiconductor device according to item 5 or 6, further including:
a scale adjusting circuit between the main memory and the reconfigurable device, the scale adjusting circuit adjusting circuit scales of the main memory and the reconfigurable device.

Advantageous Effect of Invention

The present embodiment can reduce main memory access from a CPU, and thus achieve an increase in speed of data processing.

BRIEF DESCRIPTION OF DRAWINGS

FIG. 5 is a circuit diagram of an address transition detecting section according to the present embodiment.

FIG. 13 is a diagram showing an example of MLUTs.

FIG. 14 is a diagram showing an example of an MLUT that operates as a logic circuit.

FIG. 15 is a diagram showing a truth table of the logic circuit shown in FIG. 14.

FIG. 16 is a diagram showing an example of an MLUT that operates as a connecting element.

FIG. 17 is a diagram showing a truth table of the connecting element shown in FIG. 16.

FIG. 18 is a diagram showing an example of the connecting element implemented by the MLUT having four AD pairs.

FIG. 19 is a diagram showing an example in which one MLUT operates as a logic element and a connecting element.

FIG. 20 illustrates a truth table of the logic element and the connecting element shown in FIG. 19.

FIG. 21 is a diagram showing an example of the logic operation and the connecting element implemented by the MLUT having AD pairs.

DESCRIPTION OF EMBODIMENTS

Sections of 1. Computer Device and Semiconductor Device, 2. MRLD, 3. MLUT, 4. Logic Operation of MLUT, and 5. Method of Generating Truth Table Data will hereinafter be described in order with reference to the drawings.

1. Computer Device and Semiconductor Device

A processor makes information search for data in a main memory while sequentially checking addresses. Thus, for the processor, the information search is processing involving very much time and a very heavy load. Hence, to perform efficient information processing, generally, organization and processing are performed in advance to determine which information is present at which addresses in memory, for example, and metadata is prepared to be able to reduce the load of the information search on the processor. For example, that is a hash table. However, the preparation of the metadata takes much time. Thus, data maintenance needs to be repeated, and it is necessary to increase the size of the device by the parallelization of processors or the like, and provide a large amount of power. A computer device or a semiconductor device to be illustrated in the following can implement various functions in memory without requiring metadata.

1.1 Computer Device

Figure 1:
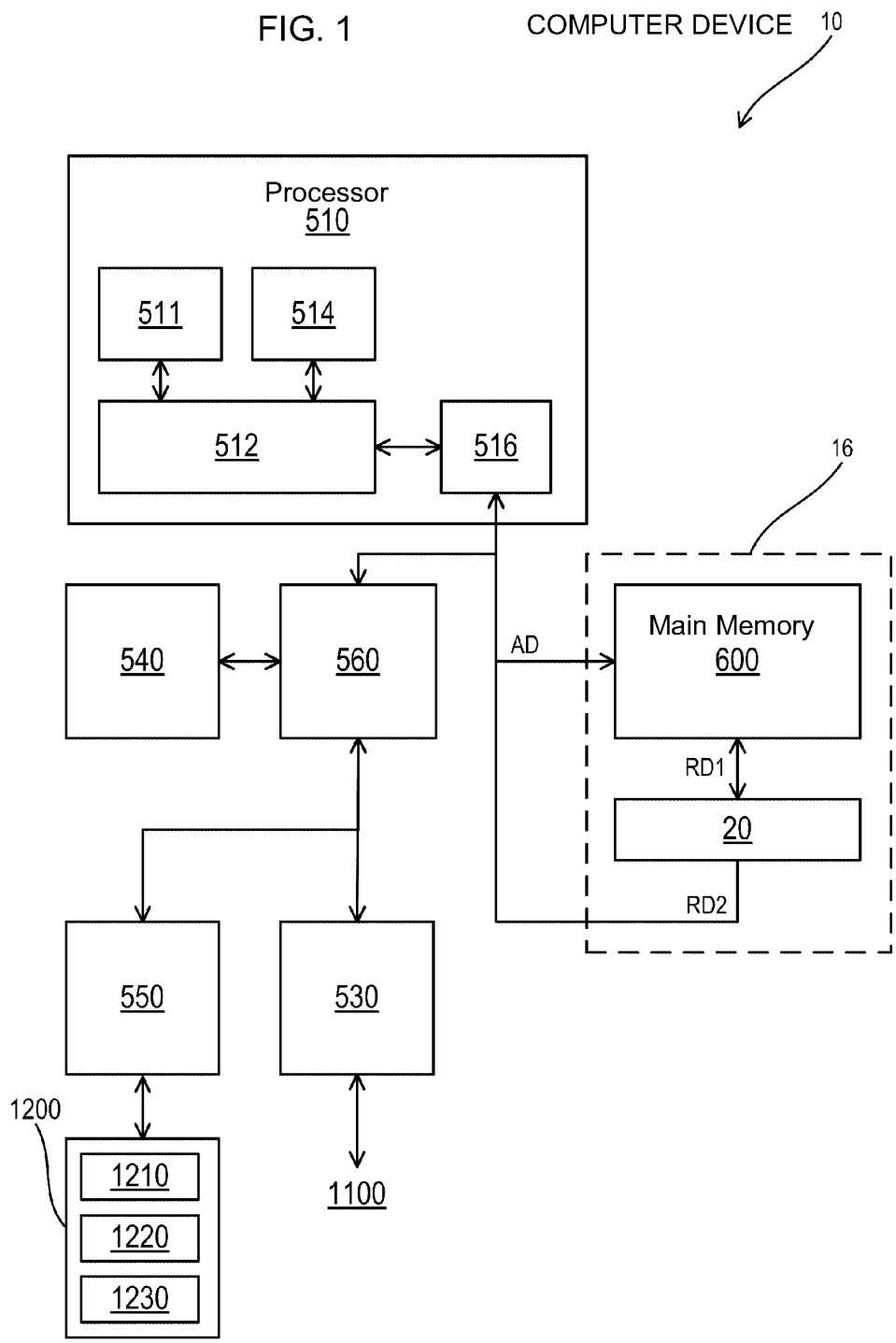
FIG. 1 is a diagram showing a first example of general configuration of a computer device according to the present embodiment.

FIG. 1 is a diagram showing a first example of general configuration of a computer device according to the present embodiment. As shown in FIG. 1, the computer device 10 includes a processor 510, a main memory 600, a communicating section 530, an external storage device 540, a drive device 550, and an input/output (I/O) controller 560.

The processor 510 includes a processor core 511, a level 2 (L2) cache controller 512, an L2 cache memory 514, and a memory controller 516. In addition, the processor 510 connects to the communicating section 530 and the external storage device 540 via the I/O controller 560. The processor 510 is a device that executes a program stored in the main memory 600, and thereby loads data from the main memory 600, performs operation on the loaded data, and stores a result of the operation in the main memory 600.

The memory controller 516 interfaces with the main memory, by reading out and writing data to the main memory 600 on the computer device 10, refreshing the main memory 600 in a case where the main memory 600 is a dynamic random access memory (DRAM), and the like. The memory controller 516, for example, loads data from the main memory 600 to the L2 cache memory 514 and stores data from the L2 cache controller 512 into the main memory 600.

The L2 cache memory 514 retains part of data stored by the main memory 600. In addition, the L2 cache memory 514 includes data retained by a level 1 (L1) cache memory possessed by the processor core 511.

The L2 cache controller 512 operates so as to store data accessed from the processor core 511 with a high frequency into the L2 cache memory 514 and evict data accessed with a low frequency from the L2 cache memory 514 into the main memory 600.

The processor core 511 is, for example, a processor core, and has arithmetic functions of the processor 510 described above. Incidentally, while one processor core is shown in FIG. 1, there may be a plurality of processor cores. In a case where the processor 510 has a plurality of processor cores, the processor 510 operates such that one processor core operates as a master and executes a program, and the other processor core(s) as a slave execute(s) the program in a sharing manner. The operation of such a master may be implemented by describing the operation as an instruction sequence within the program, and executing the instruction sequence.

The I/O controller 560 is an input-output control device that controls connection between the processor 510 and other units. The I/O controller 560 operates according to a standard such, for example, as peripheral component interconnect express (PCI Express).

The main memory 600 is a device that stores data and a program. The processor 510 can access the main memory 600 without an intervention of the I/O controller 560. The main memory 600 is, for example, a DRAM.

The external storage device 540 is a nonvolatile storage device that stores the program and the data stored in the main memory 600. The external storage device 540 is a disk array using magnetic disks, a solid state drive (SSD) using a flash memory, or the like.

The communicating section 530 connects to a network 1100 as a communication path, and transmits and receives data between another computer device connected to the network 1100 and the computer device 10. The communicating section 530 is, for example, a network interface controller (NIC).

The drive device 550 is a device that reads and writes a storage medium 1200 such, for example, as a floppy (registered trademark) disk, a compact disc read only memory (CD-ROM), or a digital versatile disc (DVD). The drive device 550 includes a motor that rotates the storage medium 1200, a head that reads and writes data on the storage medium 1200, and the like. Incidentally, the storage medium 1200 can store programs. For example, the storage medium 1200 can store not only a program that defines arithmetic processing but also a circuit description language 1210 such as a C language description, or a hardware description language (HDL) for designing an integrated circuit, and a logical configuration program 1220 for generating truth table data 1230. The truth table data 1230 is generated by the processor core 511. However, as shown in the figure, the truth table data 1230 may be stored on the storage medium 1200 and transported. In this case, the truth table data 1230 is generated by another computer device not shown in the figure. The drive device 550 reads a program from the storage medium 1200 set in the drive device 550. The processor 510 stores the program read by the drive device 550 in the main memory 600 or the external storage device 540. Incidentally, the truth table data 1230 is written to a reconfigurable device 20, and makes the reconfigurable device 20 perform desired arithmetic processing, whereas the other program is executed by the processor core. The truth table data 1230 and the other program are distinguished from each other in this respect.

1.1 Semiconductor Device

Reference numeral 16 denotes a semiconductor device constituted of at least the main memory and the reconfigurable device. The reconfigurable device 20 is connected to a data output of the main memory 600. A circuit that performs simple operation is implemented as the reconfigurable device. For example, that is a sequential comparator or an automaton.

When the memory controller 516 reads a predetermined address space on the basis of an address AD, the reconfigurable device 20 performs operation on data RD1 output from the address space of the main memory 600, and outputs necessary data RD2 to the memory controller 516. At this time, the data amount of the data RD2 obtained by applying the arithmetic processing to the data RD1 is data after data processing performed by a conventional processor. Thus, the processing load of the processor 510 can be decreased.

According to an instruction read from the L1 cache memory not shown in the figure, the processor core 511 applies processing specified by the instruction to data retained in a register not shown in the figure. The instruction includes floating-point arithmetic, integer arithmetic, address generation, branch instruction execution, store or load operation, and the like. That is, the processor core 511 can execute any instruction dynamically according to a program. On the other hand, as will be described later, the reconfigurable device 20 is configured by MLUTs, and reconfiguration thereof requires memory rewriting processing. Thus, the reconfigurable device 20 cannot perform a plurality of pieces of arithmetic processing at higher speed than the processor core 511 whose circuit configuration is made according to a predetermined instruction. However, by, for example, performing data search processing in image processing and parallel operation of data search processing, it is possible to reduce main memory access from the processor 510 dramatically, and thus improve the throughput of the computer device 10 significantly.

A data output line of the main memory 600 is connected to an address input line of the reconfigurable device 20. Because the main memory 600 is highly integrated, it is preferable that the reconfigurable device 20 be similarly highly integrated. Therefore, the memory of the reconfigurable device 20 is preferably formed by a DRAM, which constitutes the main memory.

Figure 2:
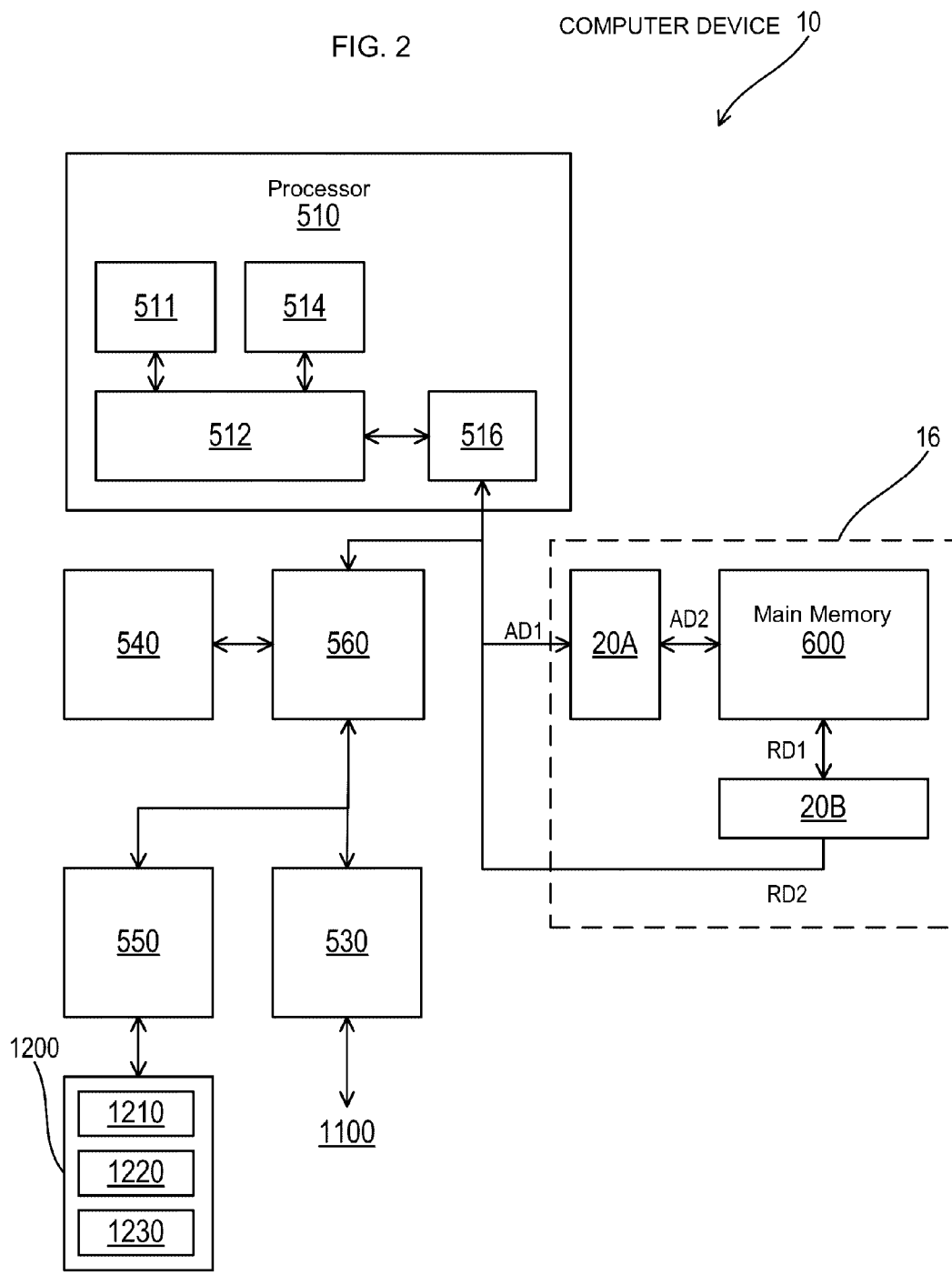
FIG. 2 is a diagram showing a second example of general configuration of the computer device according to the present embodiment.

FIG. 2 is a diagram showing a second example of general configuration of the computer device according to the present embodiment. Unlike FIG. 1, a reconfigurable device 20A is incorporated in a stage preceding an address input of a main memory 600.

When a memory controller 516 reads a predetermined address space on the basis of an address AD1, the reconfigurable device 20A converts the address AD1 into an address AD2. A reconfigurable device 20B performs operation on data RD1 output from the address space of the main memory 600 on the basis of the address AD2, and outputs data RD2 to the memory controller 516.

The reconfigurable devices 20A and 20B implement memory defect repair, content addressable memory (CAM), and the like. The memory defect repair turns a defect into a non-defective product by replacing defective bits with redundant bits in order to improve yield. The main memory generally has a fixed repair circuit. This memory defect repair can also be implemented in the reconfigurable device 20A. Therefore, a test is conducted, and defects can be repaired autonomously by being switched to other addresses.

Figure 3:
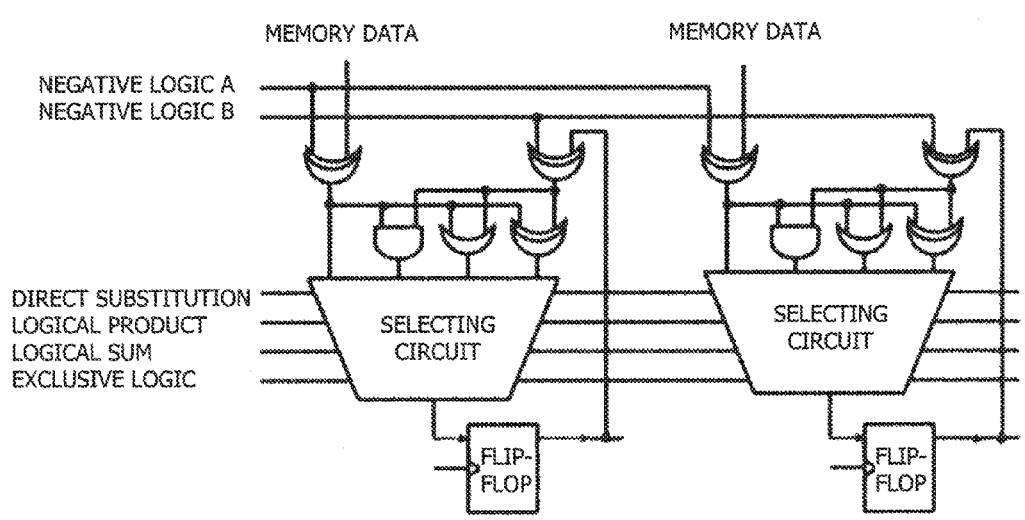
FIG. 3 is a diagram showing an example of a configured arithmetic unit.

FIG. 3 shows an example of a configured arithmetic unit. The reconfigurable device 20 can form the arithmetic unit of FIG. 3 for each data output in parallel. For memory data of a word address which memory data is selected and read from the main memory 600, direct substitution into a flip-flop, a logical product with a past flag of the flip-flop, a logical sum, exclusive logic, and a logical negation of both of the memory data and past data of flip-flop output are freely selected, and arbitrary one-bit operation can be performed with n bits in parallel with each other. For example, when operation is performed on data of eight bits, the operation is performed by repeating the one-bit operation a predetermined times. All information processing is possible with this operation system when data for present information processing is information in which each bit is defined, the information being an aggregate of one-bit data.

In addition, as will be described later, the reconfigurable device is constituted of logic units referred to as MLUTs. These logic units are configured as a logic element and/or a connecting element by storing truth table data. Thus, configurable circuits are not limited to the arithmetic unit shown in FIG. 3.

In addition, the reconfigurable devices 20A and 20B can implement CAM. The CAM has a circuit configuration on a very large scale because the CAM has a coincidence circuit in each individual memory cell, the CAM needs to be produced from circuit design with a special memory, and a memory intellectual property (IP) cannot be used. However, when the reconfigurable device 20A registers data in such a form as an index at a time of the data registration in the main memory 600, it is possible to output addresses of the main memory 600 storing data words.

2. MRLD

The reconfigurable logic device will hereinafter be referred to also as a memory based reconfigurable logic device (MRLD) (registered trademark), and will be described using a same reference numeral 20. In the MRLD, direct connection is established between MLUTs without the intervention of wiring elements, and functions of a synchronous static random access memory (SRAM) provided as a memory IP are utilized effectively. Incidentally, though not shown in figures for the following description of MLUTs, an address transition detecting section is provided in the MLUTs, and desynchronization is achieved even in the synchronous SRAM. Therefore, at the same time as the desynchronization, no input signal is input to blocks not constituting logic, and no address transition occurs, so that power can be reduced. An input signal is input to blocks constituting logic. Thus, clock generation is performed, and a predetermined logical value can be output.

Figure 4:
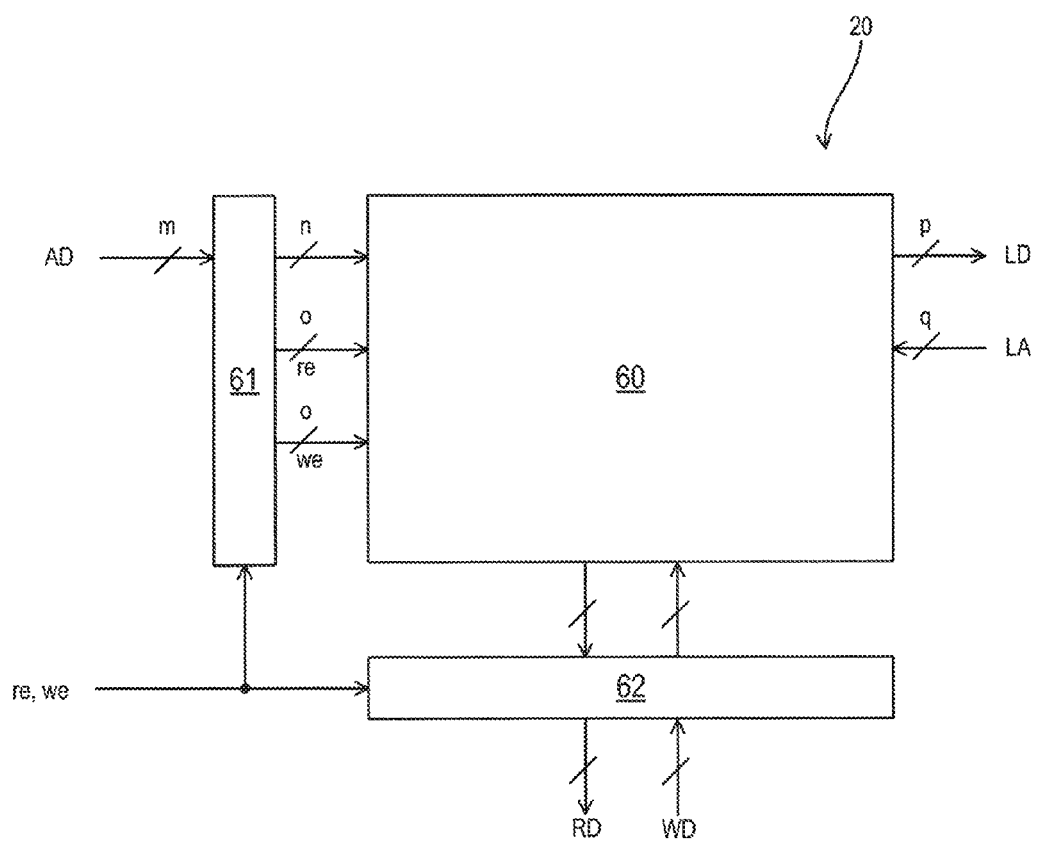
FIG. 4 is a diagram showing an example of an MRLD.

Reference numeral 20 shown in FIG. 4 denotes an example of the MRLD. The MRLD 20 includes: an MLUT array 60 in which a plurality of MLUTs 30 using synchronous SRAMs are arranged in the form of an array; and a row decoder 61 and a column decoder 62 that specify memory cells as objects of memory reading operation and writing operation in the MLUTs 30.

The MLUTs 30 are constituted of synchronous SRAMs. Storage elements of the memories each store data regarded as a truth table. The MLUTs 30 thereby perform logic operation as a logic element or a connecting element or a logic element and a connecting element.

In the logic operation of the MRLD 20, signals of a logic address LA and logic data LD indicated by solid lines are used. The logic address LA is used as an input signal for a logic circuit. The logic data LD is used as an output signal of the logic circuit. The logic address LA of the MLUTs 30 is connected to a data line of logic operation data LD of an adjacent MLUT.

The logic implemented by the logic operation of the MRLD 20 is implemented by truth table data stored in the MLUTs 30. Some of the MLUTs 30 operate as a logic element as a combinational circuit such as an AND circuit, or an adder. The other MLUTs operate as a connecting element establishing connection between the MLUTs 30 implementing the combinational circuits. The rewriting of truth table data for the implementation of logic elements and connecting elements by the MLUTs 30 is performed by memory writing operation.

An operation of writing the MRLD 20 is performed by a writing address AD and writing data WD. An operation of reading the MRLD 20 is performed by a writing address AD and reading data RD.

The writing addresses AD are addresses specifying memory cells within the MLUTs 30. The writing addresses AD specify n memory cells by m signal lines, the number n being two raised to the power of m. The row decoder 61 receives an MLUT address via the m signal lines, decodes the MLUT address, and selects and specifies an MLUT 30 as a target of memory operation. The memory operation address is used in both cases of memory reading operation and writing operation, and is decoded by the row decoder 61 and the column decoder 62 via the m signal lines to select a target memory cell. Incidentally, in the present embodiment, as will be described later, the logic address LA is decoded by a decoder within the MLUT.

According to control signals such as a read enable signal re and a write enable signal we, the row decoder 61 decodes x bits of m bits of a writing address AD, and outputs a decoded address n to an MLUT 30. The decoded address n is used as an address specifying a memory cell within the MLUT 30.

The column decoder 62 decodes y bits of the m bits of the writing address AD. The column decoder 62 has a function similar to that of the row decoder 61 and outputs the decoded address n to the MLUT 30. In addition, the column decoder 62 outputs the writing data WD and receives the reading data RD input thereto.

Incidentally, in a case where the MLUT array has s rows and t columns, data of n×t bits is input from the MLUT array 60 to the row decoder 61. Here, in order to select MLUTs in each row, the row decoder outputs re and we for o rows. That is, the o rows correspond to the s rows of the MLUTs. Here, a word line of particular memory cells is selected by activating only one bit of the o bits. Then, t MLUTs output data of n bits. Thus, the data of n×t bits is selected from the MLUT array 60. The column decoder 62 is used to select one column of the MLUT array 60.

In the case of the reconfigurable device 20 shown in FIG. 1, AD in FIG. 4 corresponds to RD1 in FIG. 1, and RD in FIG. 4 corresponds to RD2 in FIG. 1.

In the case of 20A shown in FIG. 2, AD in FIG. 4 corresponds to AD1 in FIG. 2, and RD in FIG. 4 corresponds to AD2 in FIG. 2. In the case of 20B shown in FIG. 2, AD in FIG. 4 corresponds to RD1 in FIG. 2, and RD in FIG. 4 corresponds to RD2 in FIG. 2.

3. MLUT

Figure 7:
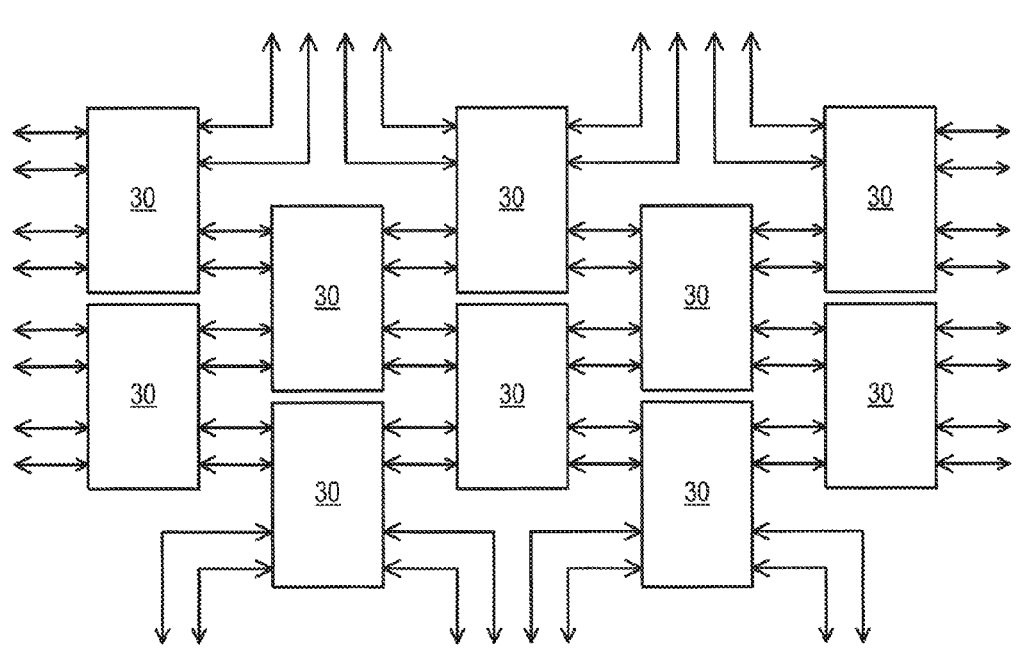
FIG. 7 is a diagram schematically showing a multi look up table (MLUT) formed by horizontally stacking MLUTs constituted of two memory cell units.
Figure 8:
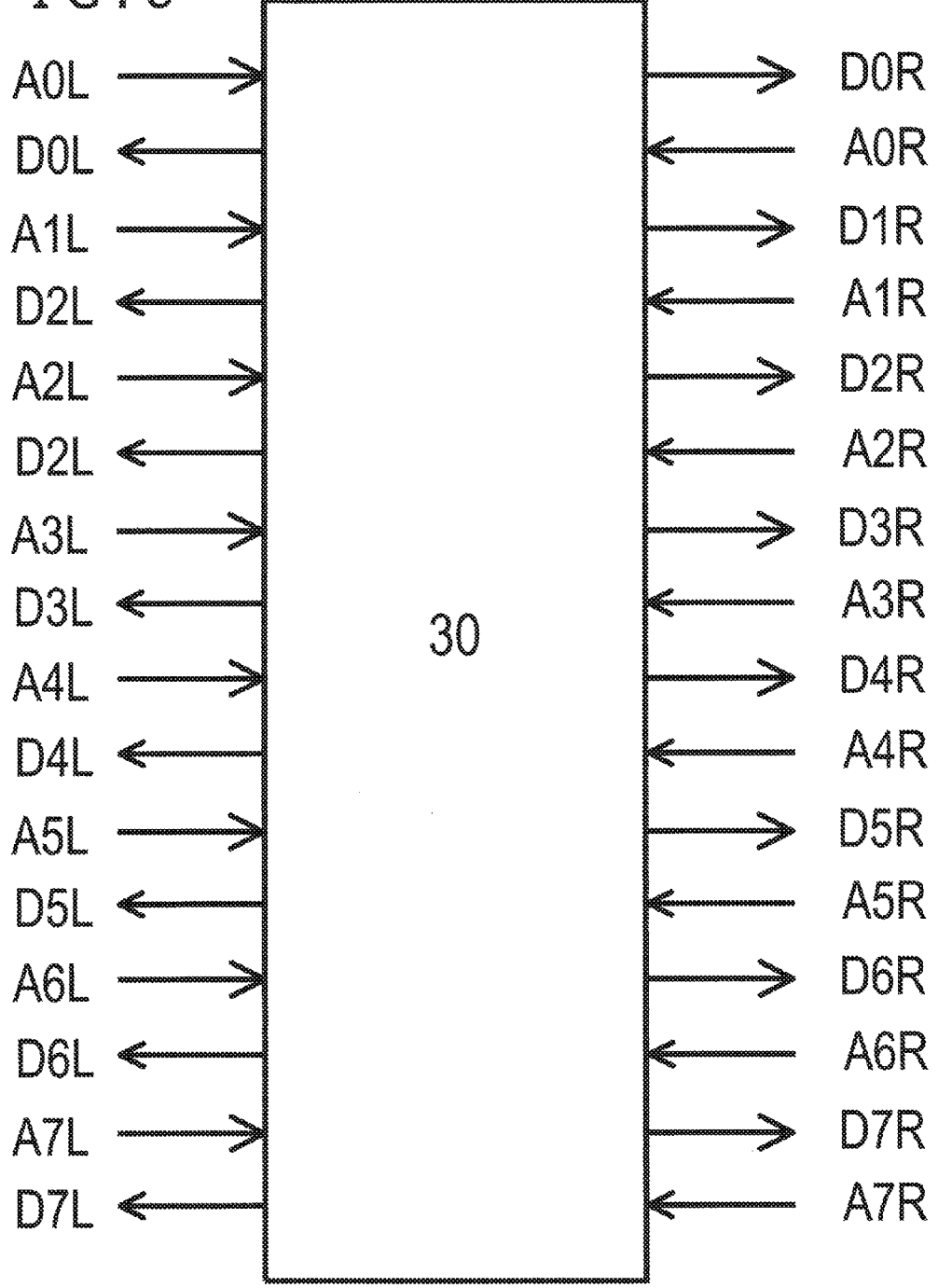
FIG. 8 is a diagram showing an example of an MLUT using a high-capacity memory.
Figure 9:
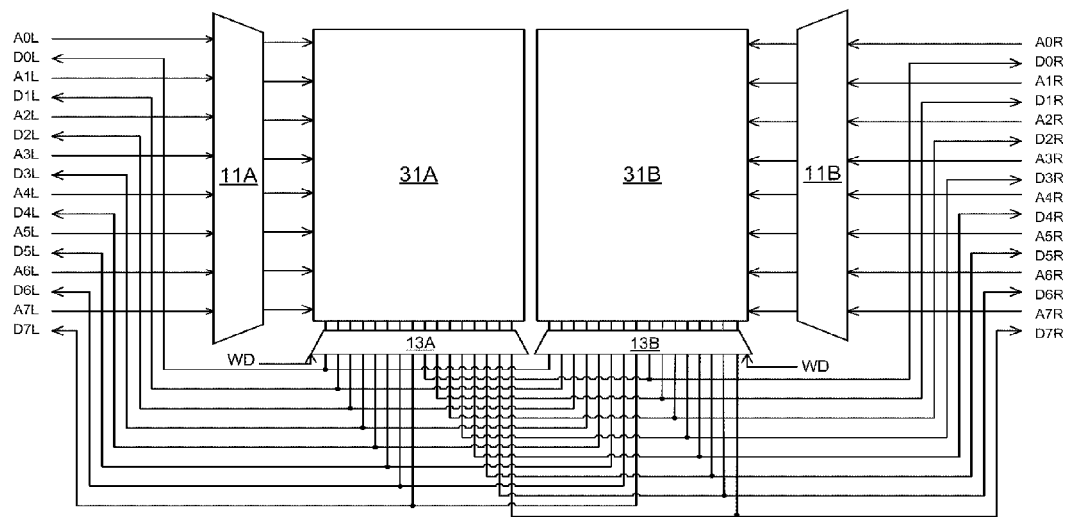
FIG. 9 is a diagram showing a circuit example of the MLUT shown in FIG. 8.

FIG. 7 is a diagram schematically showing the MRLD formed by horizontally stacking MLUTs constituted of two memory cell units shown in FIG. 9. FIG. 8 is a diagram showing input and output lines of an MLUT. The MLUTs 30 shown in FIG. 7 have inputs of addresses A0L to A7L shown in FIG. 8 from a left direction and inputs of addresses A0R to A7R shown in FIG. 8 from a right direction, and have outputs of data D0L to D7L shown in FIG. 8 in the left direction and outputs of data D0R to D7R shown in FIG. 8 in the right direction. For MLUTs with the value n=8, the conventional system uses 1 Mbits, and uses 4 Mbits corresponding to a configurable logic block (CLB), thus resulting in a large scale. On the other hand, with the present proposal, as will be described later, the MLUTs are configured with 8K (256 words×16 bits×two MLUTs) bits.

FIG. 9 is a diagram showing a circuit example of the MLUT shown in FIG. 8. The MLUT 30 shown in FIG. 9 has memory cell units 31A and 31B. The memory cell units are, for example, an SRAM.

As shown in FIG. 9, the memory cell unit 31A has a plurality of memory cells that are specified by first plural address lines from one side and which perform output to first plural data lines whose number is twice that of the first plural address lines. The memory cell unit 31B has a plurality of memory cells that are specified by second plural address lines from another side and which perform output to second plural data lines whose number is twice that of the second plural address lines. The MLUT 30 performs output of part of the first plural data lines and the second plural data lines to the one side, and performs output of other part of the first plural data lines and the second plural data lines to the other side.

Each of the memory cell units stores truth table data in each direction in the memory cells. Therefore, each of the memory cell units 31A and 31B stores truth table data for a direction from the right to the left and truth table data for a direction from the left to the right. That is, the MLUT stores two pieces of truth table data each defining a particular data output direction.

By making the number of pieces of data of each memory cell unit larger than the number of addresses, and setting two directions as directions of data output from each memory cell unit, it is possible to decrease the number of necessary memory cells, and enable data output in both directions.

Figure 10:
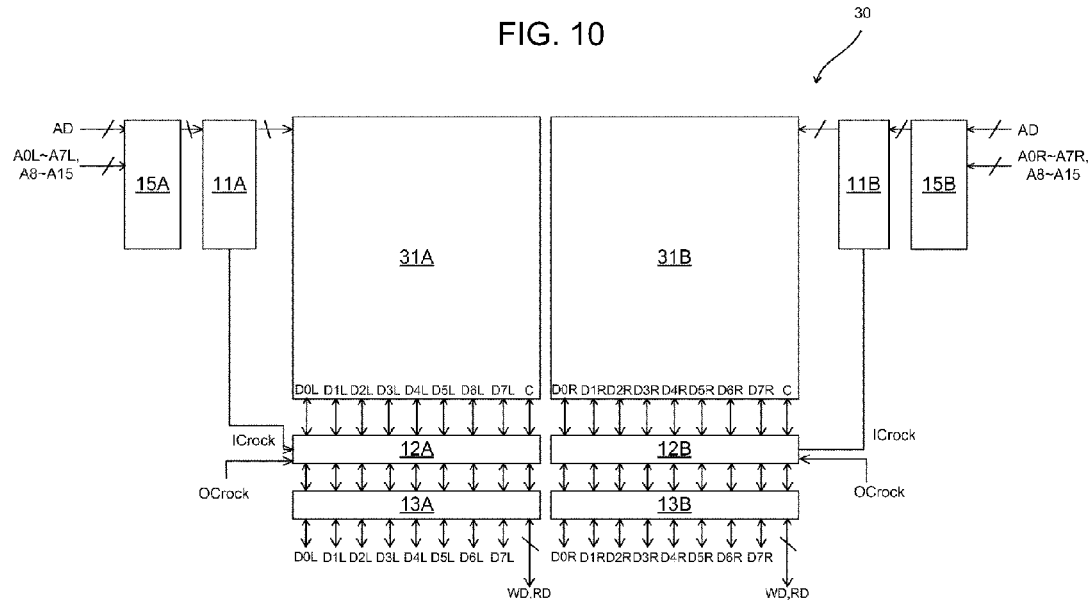
FIG. 10 is a diagram of assistance in explaining the MRLD using the MLUT shown in FIG. 8.

FIG. 10 shows a more detailed circuit example of the MLUT shown in FIG. 9. The MLUT 30 shown in FIG. 10 includes the memory cell units 31A and 31B, address decoders 11A and 11B, address selectors 15A and 15B, I/O buffers 12A and 12B, and data selectors 13A and 13B. The memory cell units 31A and 31B of the MLUT 30 each include an address decoder, an address selector, an I/O buffer, and a data selector. Input addresses to the memory cell units 31A and 31B are addresses A0L to A7L and A8 to A15 and addresses A0R to A7R and A8 to A15, respectively. The memory cell units 31A and 31B therefore have a high capacity of 512 K, which is two raised to the power of 16 (65,536) words×8 bits.

In FIG. 9, the memory cell units 31A and 31B have inputs of addresses A0L to A7L and A8 to A15 and address addresses A0R to A7R and A8 to A15, respectively.

Incidentally, FIG. 9 is a schematic diagram, and does not show decoders as peripheral circuits of the memory cell units or the like. As for decoders, the address decoders 11A and 11B described with reference to FIG. 10 are prepared for the respective memory cell units, and are arranged between the address selectors 15A and 15B and the memory cell units 31A and 31B. Hence, the address decoders may decode all of addresses output from the address selectors 15A and 15B.

The address selectors 15A and 15B are selecting circuits for switching between address lines for logic operation and addresses for writing. The address selectors 15A and 15B are necessary in a case of single-port memory cells. The address selectors are not necessary in a case of dual-port memory cells. The data selectors 13A and 13B are selecting circuits that switch to output data or writing data WD.

A conventional high-capacity memory device can be used for the MRLD without semiconductor design prototyping, and manufacturing of a dedicated small SRAM. When the MRLD is constructed on a chip, a memory IP is used.

However, in a case of a very low memory capacity required by conventional MLUTs, address decoders and sense amplifiers have a large area, and a composition ratio of memory itself is 50% or less. This represents overhead of the MRLD, and hence poor efficiency. In a case of high-capacity memory, the ratio of address decoders and sense amplifiers is decreased, and thus memory usage efficiency is increased. The present proposal suitable for high-capacity memory is therefore effective in cases of MRLD chips.

3.2 MLUT Having Memory Cell Units for Synchronous/Asynchronous Operation

An MLUT to be described in the following is a bidirectional arrangement MLUT, and has the same functional configuration as the MLUT described with reference to FIG. 7 and FIG. 8. However, unlike the bidirectional arrangement MLUT described above, memory cell units for synchronous operation and memory cell units for asynchronous operation are provided. The memory cell units for synchronous operation or the memory cell units for asynchronous operation constitute a pair. However, one of the memory cell units operates as a logic element and/or a connecting element. Data outputs of the two memory cell units are connected to each other by wired OR connection or an OR circuit. Thus, the memory cell units that do not operate store data of all "0s."

Figure 11:
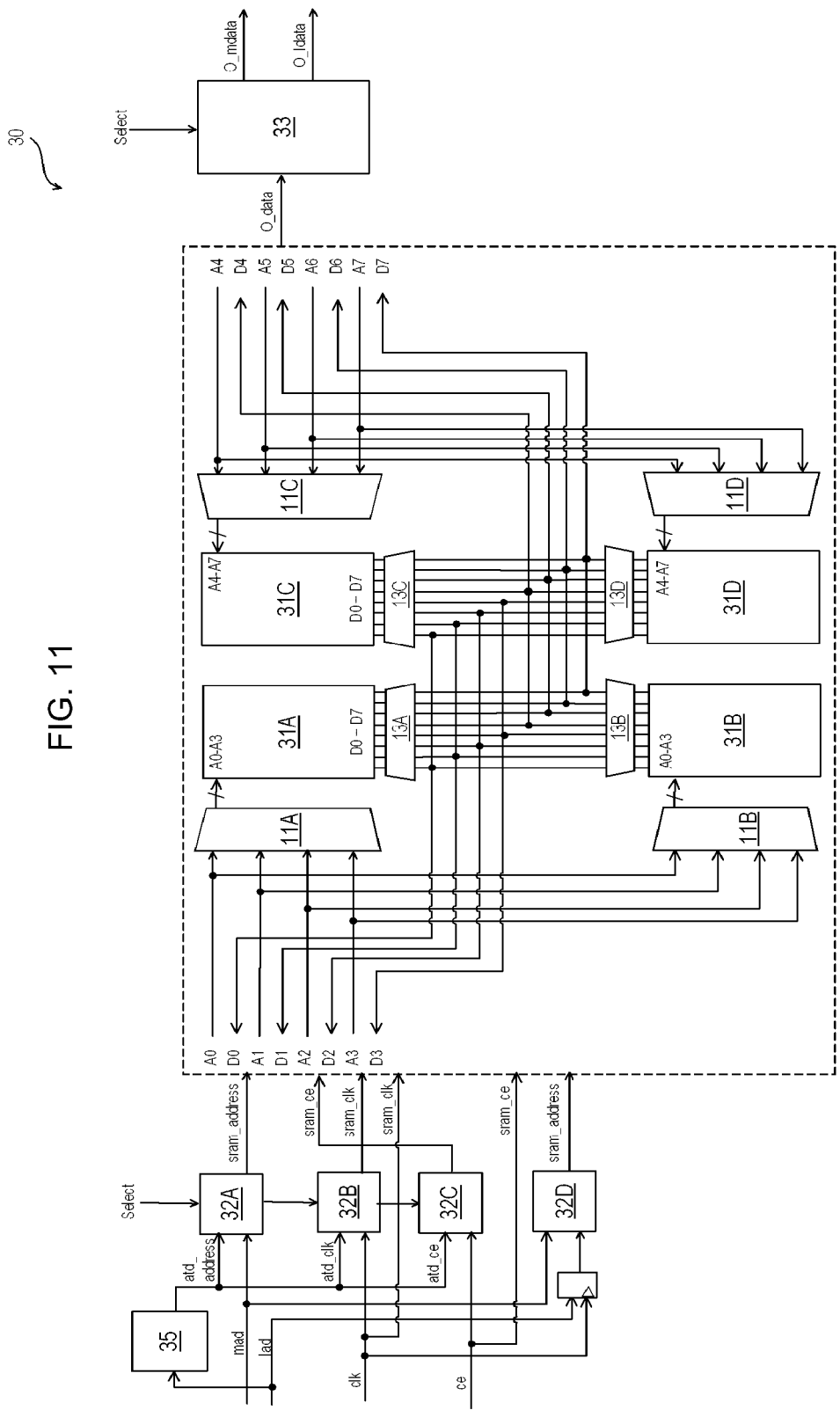
FIG. 11 is a diagram showing a circuit example of an MLUT capable of synchronous/asynchronous switching according to a second embodiment.

FIG. 11 is a diagram showing a circuit example of an MLUT capable of synchronous/asynchronous switching. The MLUT 30 shown in FIG. 11 includes memory cell units 31A to 31D, address decoders 11A to 11D, I/O buffers 13A to 13D, selecting circuits 32A to 32D, a data selecting circuit 33, and an address transition detecting section 35. The address transition detecting section 35 includes an address transition detector (ATD) circuit. The address transition detecting section 35 compares a logical address transmitted together with a clock with a logical address transmitted last time, and detects an address transition.

Figure 6:
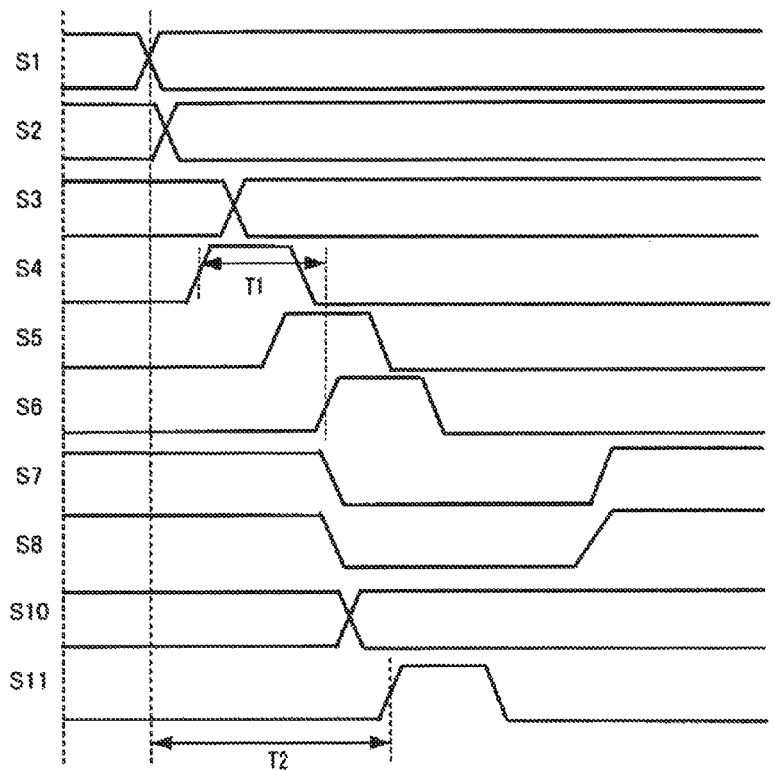
FIG. 6 is a timing diagram of signals of the address transition detection shown in FIG. 5.

FIG. 5 is a circuit diagram showing an example of the address transition detecting section. FIG. 6 is a timing diagram of the address transition detecting section. The address transition detecting section 35 includes negative OR (NOR) circuits 110A and 110B, a logical sum (OR) circuit 120, an exclusive OR (EOR) circuit 130, delay circuits 140A to 140C, a flip-flop (FF) 150, inverters 160A and 160B, and a D-latch 170.

A signal S1 is an address input signal output from the processor. A signal S2 is an output of the D-latch. When there is a change in the signal S1, the D-latch 170 latches the signal S1 so as not to change for a certain period. This is to ignore a subsequent address transition due to noise or the like.

A signal S3 is a delayed signal output from the D-latch 170. As shown in FIG. 5, the delayed signal is delayed in the delay circuit 140B to form a clock with a rising edge and a falling edge, and generate a clock width of a signal S4.

The signal S4 generated as a clock signal detects a change, and is output from the EOR 130. The EOR 130 is supplied with the input and output of the delay circuit 140B. Thus, when the signal levels of the input and output of the delay circuit 140B differ from each other, the EOR 130 outputs a signal level "high." Therefore, an address transition can be detected. A time T1 of S4 shown in FIG. 6 represents a time from the detection of the change in the logical address to FF capturing. A time T2 represents a time from the detection of the change in the logical address to memory cell unit readout.

The OR circuit 120 is supplied with the signal S4 and other address transition signals, and outputs an OR operation value. The output of the OR circuit 120 is delayed by the delay circuit 140C, so that a signal S5 is output.

The signal S5 is a delayed signal output from the delay circuit 140C. The signal S5 waits for an enable signal of the D-latch 170, and performs clock input.

A signal S6 is a signal extension of the signal S5, and is a pulse formation of the enable signal. The NOR circuit 110A outputs a signal S7 as a NOR operation value of the signals S5 and S6. The signal S7 then becomes the enable signal of the D-latch 170. A signal S8 is a signal obtained by inverting the signal S5 in the inverter 160A. The signal S8 is used as an address signal latching clock in the FF 150. A signal S9 is used as an enable for a memory cell unit 31 in a subsequent stage. A signal S10 is used as a clock (atd_clk) for the memory cell unit 31. A signal S11 is used as an address of the memory cell unit 31. The signal S10 in FIG. 5 represents a time from the detection of the change in the logical address to a read from the memory.

Thus, when the processor core 511 shown in FIG. 1 or FIG. 2 makes a data request, for example, the clock is generated on the basis of a change in the address as a target of the data request, and the memory is driven. Thus, the memory operates when needed, and the memory is not driven when not needed. A reduction in power consumption can therefore be achieved autonomously.

A. Signal Line

Signal lines shown in FIG. 11 will be described in the following Table 1.

TABLE 1

| Signal name | Bit length | IO | Description |
|---|---|---|---|
| mad | <5:0> | I | Memory address |
| lad | I | I | Logical address |
| clk | I | I | Clock |
| ce | I | I | SRAM chip enable |
| we | I | I | SRAM write enable |
| i_data | <7:0> | I | SRAM write data |
| odata | <7:0> | O | SRAM data output (x4) |
| o_mdata | <7:0> | O | SRAM data output |
| o_ldata | <7:0> | O | Logic data output |
| atd_ck | — | — | ATD generated clock |
| atd_ce | — | — | ATD generated chip select |
| atd_address | — | — | ATD lad latch address |
| sram_ck(sync) | — | — | Real SRAM clock (synchronous) |
| sram_ck(async) | — | — | Real SRAM clock (asynchronous) |
| sram_ce(sync) | — | — | SRAM chip select (synchronous) |
| sram_ce(async) | — | — | SRAM chip select (asynchronous) |
| sram_address(sync) | <3:0> | — | SRAM address input (synchronous) |
| sram_address(async) | <3:0> | — | SRAM address input (asynchronous) |
| SELECT | — | — | Select signal |

B. Synchronous/Asynchronous Memory Cell Units

The memory cell units 31A to 31D are a synchronous SRAM. The memory cell units 31A to 31D each store truth table data for connection in the left direction and the right direction. The memory cell units 31B and 31D operate in synchronism with a system clock. On the other hand, the memory cell units 31A and 31C operate in synchronism with an ATD generated clock (referred to also as an "internal clock signal") generated by the address transition circuit 35, as will be described later, and therefore operate asynchronously to the clock (system clock). The ATD generated clock operates at a higher frequency than the system clock signal. Thus, the memory cell units 31A and 31C appear to operate asynchronously from the outside of the MLUT 30. An asynchronous function is thereby provided.

Except for the function requirement for synchronization, the memory cell units 31A and 31C have similar functions to those of the memory cell units 31A and 31B shown in FIG. 9 and FIG. 10. The same is true for the memory cell units 31B and 31D.

The address decoders 11A and 11B both decode addresses A0 to A3 input from a left side, output decoded signals to the memory cell units 31A and 31B, respectively, and activate word lines of the memory cell units 31A and 31B, respectively.

The address decoders 11C and 11D decode addresses A4 to A7 input from a right side, output decoded signals to the memory cell units 31C and 31D, respectively, and activate word lines of the memory cell units 31C and 31D, respectively.

In addition, the address decoders 11A and 11C decode an SRAM address asynchronous signal (sram_address (async)), and the address decoders 11A and 11C decode an SRAM address synchronous signal (sram_address (sync)). Word lines of the memory cell units which word lines are specified by the decoded signals are activated.

In the example shown in FIG. 11, each of the memory cell units is a memory block of 16 words×8 bits. The memory cell units 31A and 31B can be used as 16 words×8 bits×2 in a synchronous mode, and can be used as 16 words×8 bits×2 in an asynchronous mode. Synchronous operation and asynchronous operation cannot be performed simultaneously. For example, in a case where logic data is written to the synchronously operating memory cell unit, "0s" need to be written to the whole of the asynchronously operating memory cell unit.

Incidentally, the data outputs of the memory cell units may be provided with a wired OR as shown in the figure, or may be provided with an OR logic circuit.

C. Selecting Circuits

Selection conditions of the selecting circuits are shown in the following table.

TABLE 2

* mlctrl = 0/1: logic mode/config mode
sram_ck

| mlctrl | sram_ck (async) | mlctrl | sram_ck (sync) |
|---|---|---|---|
| 0 | atd_clk | — | clk |
| 1 | clk | | | sram_ce

| reset | mlctrl | sram_ce (async) | reset | mlctrl | sram_ce (sync) |
|---|---|---|---|---|---|
| 1 | 0 | atd_ce | 1 | 0 | 0 |
| 1 | 1 | ce | 1 | 1 | ce |
| 0 | 1 | 0 | 0 | 1 | 0 |
| otherwise | | 1 | otherwise | | 1 |

* address = 0 of all of the SRAMs is read with reset = 0, and output is determined once.
sram_address

| reset | mlctrl | sram_address (async) | reset | mlctrl | sram_address (sync) |
|---|---|---|---|---|---|
| 1 | 0 | atd_address | 1 | 0 | lad |
| 1 | 1 | mad | 1 | 1 | mad |
| otherwise | | 0 | otherwise | | 0 |

The selecting circuits 32A to 32D are circuits for selecting the operation of the memory cell units 31A and 31C for asynchronous operation or the memory cell units 31B and 31D for synchronous operation.

When the asynchronous operation is selected by a selection signal (Select), the selecting circuit 32A selects an atd_ad latch address (S11 shown in FIG. 3) generated by the address transition circuit 35, and outputs the atd_ad latch address as an SRAM address asynchronous signal (sram_address (async)). When the asynchronous operation is not selected, the selecting circuit 32A outputs a logical address as it is.

When the asynchronous operation is selected by the selection signal (Select), the selecting circuit 32B selects and outputs the ATD generated clock generated by the address transition circuit 35. When the asynchronous operation is not selected, the selecting circuit 32B outputs a clock as it is.

When the asynchronous operation is selected by the selection signal (Select), the selecting circuit 32C selects and outputs an ATD generated chip select generated by the address transition circuit 35. When the asynchronous operation is not selected, the selecting circuit 32C outputs an SRAM chip enable as it is.

When the synchronous operation is selected by the selection signal (Select), the selecting circuit 32D outputs the logical address as it is.

D. Prohibited Logic

In addition, there is a prohibited logical configuration as a characteristic of memory division. The necessity of prohibited logic will be described using two truth tables illustrated in Table 2.

TABLE 3

Truth Table 1

| Case | A0 | A1 | D0 |
|------|----|----|----|
| a | 0 | 0 | 0 |
| b | 0 | 1 | 0 |
| c | 1 | 0 | 0 |
| d | 1 | 1 | 1 |

Truth Table 2

| Case | A0 | A4 | D0 |
|------|----|----|----|
| a | 0 | 0 | 0 |
| b | 0 | 1 | 0 |
| c | 1 | 0 | 0 |
| d | 1 | 1 | 1 |

Truth Table 1 shows that an AND circuit is configured using A0 and A1 so as to output to D0. Truth Table 2 shows that an AND circuit is configured using A0 and A4 so as to output to D0. For logic in the case of Truth Table 1, logical operation can be performed in only the memory cell unit 31A using A3-A0. Thus, when "0s" are written to the other memory cell unit, the memory cell unit 31A is not affected by output values of the other memory cell unit because of OR operation. Therefore, the problem of prohibited logic does not occur.

In the case of logic in Truth Table 2, on the other hand, the memory cell unit using A3-A0 cannot distinguish c and d from each other. The SRAM using A7-A4 does not distinguish b and d from each other. Thus, logical operation straddling the two memory cell units cannot provide a correct value with the use of the two truth tables. The logical operation straddling the two memory cell units is therefore set as prohibited logic. Hence, when a logical configuration is made, logic needs to be implemented within each memory cell unit. The truth table data according to the present embodiment is therefore generated so as not to generate the above-described prohibited logic.

E. I/O Buffers

The I/O buffers 13A to 13D provide functions of an FF by reading data from data lines of the memory cell units in synchronism with one of the clock and the ATD generated clock. Incidentally, the I/O buffers 13A to 13D include sense amplifiers that amplify voltages output from bit lines of memory cells.

The selecting circuit 32 outputs SRAM data output (O_m-data) as one of SRAM data output and logic data output according to the selection signal.

3.3 Circuit Scale Adjusting Circuit

Figure 12:
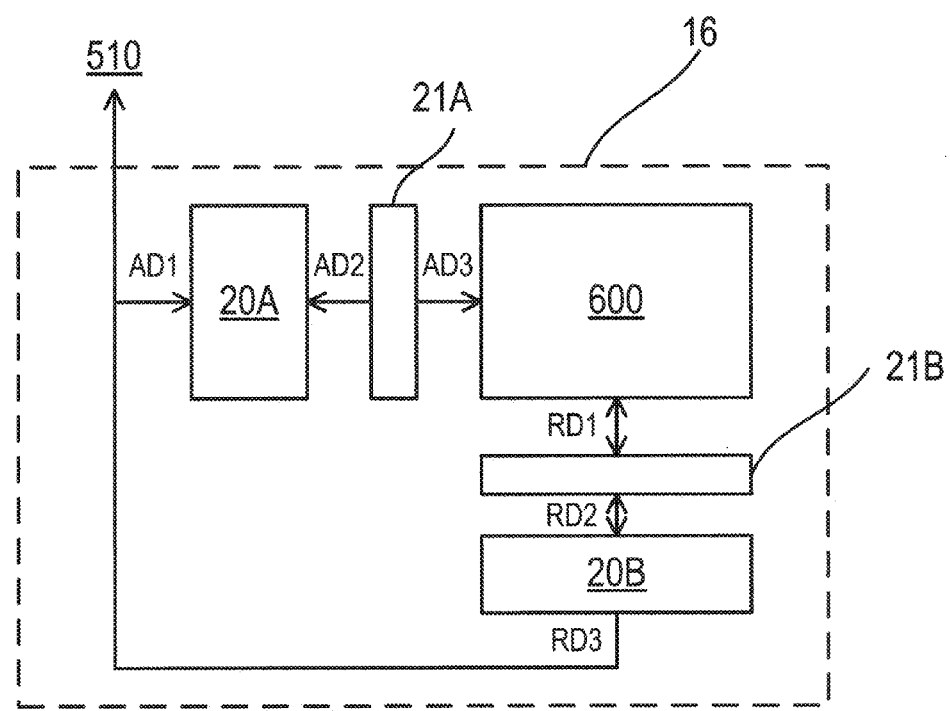
FIG. 12 is a diagram showing an example of scale adjusting circuits.

The MRLD 20 is constituted of small memory cell units. The scale of an integrated circuit of the MRLD 20 is therefore large as compared with the main memory 600, and is thus disproportionate. FIG. 12 is a diagram showing an example of scale adjusting circuits. A scale adjusting circuit 21A is disposed between the main memory 600 and the MRLD 20A, and a circuit scale adjusting circuit 21B is disposed between the main memory 600 and the MRLD 20B.

4. Logic Operation of MLUTs

A. Logic Element

FIG. 13 is a diagram showing an example of MLUTs. In FIG. 13, the representations of address selectors, I/O buffers, and data selectors are omitted to describe logic operation. MLUTs 30a and 30b shown in FIG. 13 each include four logic address input LA lines A0 to A3, four logic operation data lines D0 to D3, 4×16=64 storage elements 40, and an address decoder 9. The logic operation data lines D0 to D3 each connect 16 storage elements 40 in series with each other. The address decoder 9 is configured to select four storage elements connected to one of 16 word lines on the basis of signals input to the logic address input LA lines A0 to A3. The four storage elements are connected to the logic operation data lines D0 to D3, respectively, and output data stored in the storage elements to the logic operation data lines D0 to D3, respectively. For example, when appropriate signals are input to the logic address input LA lines A0 to A3, four storage elements 40A, 40B, 40C, and 40D can be selected. In this case, the storage element 40A is connected to the logic operation data line D0, the storage element 40B is connected to the logic operation data line D1, the storage element 40D is connected to the logic operation data line D2, and the storage element 40D is connected to the logic operation data line D3. Then, signals stored in the storage elements 40A to 40D are output to the logic operation data lines D0 to D3. Thus, the MLUTs 30A and 30B receive logic address input LA from the logic address input LA lines A0 to A3, and output, as logic operation data, values stored in four storage elements 40 selected by the address decoder 9 according to the logic address input LA to the logic operation data lines D0 to D3, respectively. Incidentally, the logic address input LA line A2 of the MLUT 30A is connected to the logic operation data line D0 of the adjacent MLUT 30B. The MLUT 30A receives logic operation data output from the MLUT 30B as logic address input LA. In addition, the logic operation data line D2 of the MLUT 30A is connected to the logic address input LA line A0 of the MLUT 30B. The MLUT 30B receives logic operation data output by the MLUT 30A as logic address input LA. For example, the logic operation data line D2 of the MLUT 30A outputs a signal stored in one of the 16 storage elements connected to the logic operation data D2 to the logic address input LA line A0 of the MLUT 30B on the basis of the signals input to the logic address input LA lines A0 to A3 of the MLUT 30A. Similarly, the logic operation data line D0 of the MLUT 30B outputs a signal stored in one of 16 storage elements connected to the logic operation data line D0 to the logic address input LA line A2 of the MLUT 30A on the basis of the signals input to the logic address input LA lines A0 to A3 of the MLUT 30B. One pair of an address line and a data line is thus used for coupling the MLUTs to each other. A pair of an address line and a data line used for coupling the MLUTs to each other such as the logic address input LA line A2 and the logic operation data line D2 of the MLUT 30A will hereinafter be referred to as an "AD pair."

Incidentally, while the MLUTs 30A and 30B have four AD pairs in FIG. 13, the number of AD pairs is not particularly limited to four, as will be described later.

FIG. 14 is a diagram showing an example of an MLUT that operates as a logic circuit. In the present example, logic address input LA lines A0 and A1 are set as inputs to a two-input NOR circuit 701, and logic address input LA lines A2 and A3 are set as inputs to a two-input NAND circuit 702. Then, a logic circuit is formed in which an output of the two-input NOR circuit 701 and an output of the two-input NAND circuit 702 are input to a two-input NAND circuit 703, and an output of the two-input NAND circuit 703 is output to a logic operation data line D0.

FIG. 15 is a diagram showing a truth table of the logic circuit shown in FIG. 14. The logic circuit of FIG. 14 is a four-input logic circuit, and therefore uses all of inputs A0 to A3 as inputs. On the other hand, there is only one output, and therefore only output D0 is used as output. "*" is entered in columns of outputs D1 to D3 in the truth table. This indicates that either value of "0" and "1" may be used. However, when truth table data is actually written to the MLUT for reconfiguration, either the value "0" or the value "1" needs to be written to these columns.

B. Connecting Element

FIG. 16 is a diagram showing an example of an MLUT that operates as a connecting element. The MLUT as a connecting element in FIG. 16 operates so as to output a signal of a logic address input LA line A0 to a logic operation data line D1, output a signal of a logic address input LA line A1 to a logic operation data line D2, and output a signal of a logic address input LA line A2 to a logic operation data line D3. The MLUT as a connecting element further operates so as to output a signal of a logic address input LA line A3 to a logic operation data line D0.

FIG. 17 is a diagram showing a truth table of the connecting element shown in FIG. 16. The connecting element shown in FIG. 16 is a four-input four-output connecting element. Hence, all of inputs A0 to A3 and all of outputs D0 to D3 are used. On the basis of the truth table shown in FIG. 17, the MLUT operates as the connecting element that outputs the signal of the input A0 to the output D1, outputs the signal of the input A1 to the output D2, outputs the signal of the input A2 to the output D3, and outputs the signal of the input A3 to the output D0.

FIG. 18 is a diagram showing an example of the connecting element implemented by the MLUT having four AD pairs, that is, an AD pair 0, an AD pair 1, an AD pair 2, and an AD pair 3. AD0 has a logic address input LA line A0 and a logic operation data line D0. AD1 has a logic address input LA line A1 and a logic operation data line D1. AD2 has a logic address input LA line A2 and a logic operation data line D2. In addition, AD3 has a logic address input LA line A3 and a logic operation data line D3. In FIG. 18, a dash-double-dot line indicates a flow of a signal input to the logic address input LA line A0 of the AD pair 0 and output to the logic operation data line D1 of the AD pair 1. A broken line indicates a flow of a signal input to the logic address input LA line A1 of the AD pair 1 and output to the logic operation data line D2 of the AD pair 2. A solid line indicates a flow of a signal input to the logic address input LA line A2 of the AD pair 2 and output to the logic operation data line D3 of the AD pair 3. A dash-single-dot line indicates a flow of a signal input to the logic address input LA line A3 of the AD pair 3 and output to the logic operation data line D0 of the AD pair 0.

Incidentally, while the MLUT 30 has four AD pairs in FIG. 18, the number of AD pairs is not particularly limited to four.

C. Combinational Functions of Logic Element and Connecting Element

FIG. 19 is a diagram showing an example in which one MLUT operates as a logic element and a connecting element. In the example shown in FIG. 19, a logic circuit is formed in which logic address input LA lines A0 and A1 are set as inputs to a two-input NOR circuit 121, an output of the two-input NOR circuit 121 and a logic address input LA line A2 are set as inputs to a two-input NAND circuit 122, and an output of the two-input NAND circuit 122 is output to a logic operation data line D0. In addition, at the same time, a connecting element is formed which outputs a signal of a logic address input LA line A3 to a logic operation data line D2.

FIG. 20 shows a truth table of the logic element and the connecting element shown in FIG. 19. Logic operation of FIG. 19 uses three inputs D0 to D3, and uses one output D0 as output. On the other hand, the connecting element in FIG. 20 is configured to output the signal of the input A3 to an output D2.

FIG. 21 is a diagram showing an example of the logic operation and the connecting element implemented by the MLUT having four AD pairs AD0, AD1, AD2, and AD3. As in the MLUT shown in FIG. 18, AD0 has a logic address input LA line A0 and a logic operation data line D0. AD1 has a logic address input LA line A1 and a logic operation data line D1. AD2 has a logic address input LA line A2 and a logic operation data line D2. In addition, AD3 has a logic address input LA line A3 and a logic operation data line D3. As described above, the MLUT 30 implements two operations of a three-input one-output logic operation and a one-input one-output connecting element as one MLUT 30. Specifically, the logic operation uses, as inputs, the logic address input LA line A0 of the AD pair 0, the logic address input LA line A1 of the AD pair 1, and the logic address input LA line A2 of the AD pair 2. Then, the address line of the logic operation data line D0 of the AD pair 0 is used as an output. In addition, as indicated by a broken line, the connecting element outputs a signal input to the logic address input LA line A3 of the AD pair 3 to the logic operation data line D2 of the AD pair 2.

5. Method of Generating Truth Table Data

The truth table data applied to the reconfigurable semiconductor devices described by using the first and second embodiments is generated by an information processing device that executes a software program for logical configuration. For example, the information processing device may be the computer device 10, and may be another computer device having hardware resources similar to those of the computer device 10 and connected to the network 1100.

An example of the computer device that generates the truth table data will be described with reference to FIG. 1 or FIG. 2. The computer device 10 includes a processor 510, a main memory 600, and a drive device 550. The processor 510 executes software 1210 for logical configuration which software is loaded from a communicating section 530 or the drive device 550, thereafter generates truth table data 1230 from a circuit description language 1220 such as a C language description, or a hardware description language (HDL) for designing an integrated circuit, and stores the truth table data 1230 in the main memory 600. The processor 510 writes the generated truth table data 1230 to the reconfigurable device 20.

The drive device 550 is a device that reads and writes a storage medium 1200 such, for example, as a DVD, or a flash memory. The drive device 550 includes a motor that rotates the storage medium 1200, a head that reads and writes data on the storage medium 1200, and the like. The drive device 550 reads a program from the set storage medium 1200. The processor 510 stores the program read by the drive device 550 or truth table data in the main memory 600.

As a result of the truth table data 1230 being read into the reconfigurable device 20, functions of a logic element and/or a connecting element are constructed by concrete means in which the truth table data and hardware resources cooperate with each other. In addition, the truth table data can also be said to be data having a structure representing a logical structure as a truth table.

The embodiments described above are only cited as typical examples. Combinations, modifications, and variations of constituent elements of the embodiments are apparent to those skilled in the art, and it is obvious that those skilled in the art would be able to make various modifications to the foregoing embodiments without departing from the principles of the present invention and the scope of the invention described in claims.

REFERENCE SIGNS LIST

10 Computer device
11 Address decoder
12 I/O buffer
13 Data selector
20 Reconfigurable device
30 MLUT
31 Memory cell unit
32 Selecting circuit
35 Address transition detecting section
60 MLUT array
61 Row decoder
62 Column decoder
510 Processor
530 Communicating section
540 External storage device
550 Drive device
600 Main memory
1100 Network
1200 Storage medium

The invention claimed is:

1. A reconfigurable device connected to a main memory, the reconfigurable device comprising:
a plurality of logic sections connected to each other by an address line or a data line;
each of the logic sections including
a plurality of address lines,
a plurality of data lines,
an address decoder that decodes addresses input from part of the plurality of address lines, and
a memory cell array unit that includes a plurality of memory cells specified by decode lines of the address decoder, and outputs data read from the specified memory cells to the data lines;
an address line of the memory cell array unit being connected to a data output line of the main memory.

2. The reconfigurable device according to claim 1, wherein the memory cell unit is a multi-look-up table.

3. The reconfigurable device according to claim 1, wherein each of the logic sections includes
a first address decoder that decodes addresses input from part of the plurality of address lines,
a second address decoder that decodes addresses input from other part of the plurality of address lines,
a first memory cell unit that has a plurality of memory cells specified by decode lines of the first address decoder, and
a second memory cell unit that has a plurality of memory cells specified by decode lines of the second address decoder.

4. The semiconductor device according to claim 3, wherein the first memory cell unit and the second memory cell unit store a plurality of pieces of truth table data, and are connected to second plural address lines that output data specifying one of the plurality of pieces of truth table data.

5. A semiconductor device comprising:
a main memory; and
a reconfigurable device connected to the main memory;
the reconfigurable device including a plurality of logic sections connected to each other by an address line or a data line;
each of the logic sections including
a plurality of address lines,
a plurality of data lines,
an address decoder that decodes addresses input from part of the plurality of address lines, and
a memory cell array unit that includes a plurality of memory cells specified by decode lines of the address decoder, and outputs data read from the specified memory cells to the data lines;
a data output of the memory cell array unit being connected to an address line of the main memory.

6. The semiconductor device according to claim 5, further comprising:
a second reconfigurable device;
the second reconfigurable device including a plurality of logic sections connected to each other by an address line or a data line;
each of the logic sections including
a plurality of address lines,
a plurality of data lines,
an address decoder that decodes addresses input from part of the plurality of address lines, and
a memory cell array unit that includes a plurality of memory cells specified by decode lines of the address decoder, and outputs data read from the specified memory cells to the data lines;
a data output of the memory cell array unit being connected to an address line of the main memory.

7. The semiconductor device according to claim 5, further comprising:
a scale adjusting circuit between the main memory and the reconfigurable device, the scale adjusting circuit adjusting circuit scales of the main memory and the reconfigurable device.

* * * * *